(12) United States Patent
Kim et al.

(10) Patent No.: US 12,426,367 B2
(45) Date of Patent: Sep. 23, 2025

(54) DISPLAY DEVICE AND METHOD OF MANUFACTURING DISPLAY DEVICE

(71) Applicant: Samsung Display Co., LTD., Yongin-si (KR)

(72) Inventors: Jay Bum Kim, Yongin-si (KR); Myeong Ho Kim, Hwaseong-si (KR); Kyoung Seok Son, Seoul (KR); Seung Jun Lee, Suwon-si (KR); Seung Hun Lee, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 698 days.

(21) Appl. No.: 17/036,619

(22) Filed: Sep. 29, 2020

(65) Prior Publication Data
US 2021/0143189 A1    May 13, 2021

(30) Foreign Application Priority Data
Nov. 8, 2019  (KR) .......................... 10-2019-0142684

(51) Int. Cl.
  *H10D 86/60*  (2025.01)
  *H10D 86/01*  (2025.01)
  *H10D 86/40*  (2025.01)

(52) U.S. Cl.
  CPC ......... *H10D 86/60* (2025.01); *H10D 86/0223* (2025.01); *H10D 86/421* (2025.01); *H10D 86/481* (2025.01)

(58) Field of Classification Search
  CPC ............. H01L 27/1255; H01L 27/1222; H01L 27/1274
  (Continued)

(56) References Cited

U.S. PATENT DOCUMENTS 9,165,993 B2 * 10/2015 Kim ...................... H01L 27/124
10,020,354 B2    7/2018 Kim et al.
(Continued)

FOREIGN PATENT DOCUMENTS

CN      102931209 A    2/2013
CN      108493198 A    9/2018
(Continued)

OTHER PUBLICATIONS

Chinese Office Action corresponding to Application No. 202011239736.6, dated on Feb. 27, 2025, 11 pages.

*Primary Examiner* — Ori Nadav
(74) *Attorney, Agent, or Firm* — Innovation Counsel LLP

(57) ABSTRACT

A display device includes a substrate, a first active layer on the substrate, a first insulation layer on the first active layer, a first gate electrode on the first insulation layer, the first gate electrode overlapping the first active layer, a second insulation layer on the first gate electrode, a second active layer on the second insulation layer, a first capacitor electrode on the second insulation layer, the first capacitor electrode overlapping the first gate electrode, a third insulation layer on the second active layer and the first capacitor electrode, a second gate electrode on the third insulation layer, the second gate electrode overlapping the second active layer, and a second capacitor electrode on the third insulation layer, the second capacitor electrode overlapping the first gate electrode and electrically connected to the first capacitor electrode.

34 Claims, 18 Drawing Sheets

(58) Field of Classification Search
USPC .......................................................... 257/79
See application file for complete search history.

(56) References Cited

U.S. PATENT DOCUMENTS

| | | | |
|---|---|---|---|
| 10,249,695 | B2 | 4/2019 | Ono et al. |
| 2004/0004221 | A1* | 1/2004 | Murade ............. H01L 29/78633 |
| | | | 257/E27.111 |
| 2012/0326150 | A1 | 12/2012 | Kim et al. |
| 2013/0037783 | A1 | 2/2013 | Lee et al. |
| 2018/0061921 | A1 | 3/2018 | Son et al. |
| 2018/0145125 | A1 | 5/2018 | Lee et al. |
| 2018/0277614 | A1* | 9/2018 | Ono .................... H01L 27/1248 |
| 2018/0366586 | A1* | 12/2018 | Son .................... H01L 29/7869 |
| 2019/0006521 | A1 | 1/2019 | Noh et al. |
| 2019/0288048 | A1 | 9/2019 | Kang et al. |
| 2021/0408190 | A1 | 12/2021 | Yang |

FOREIGN PATENT DOCUMENTS

| | | |
|---|---|---|
| CN | 110277427 A | 9/2019 |
| KR | 10-2007-0072207 | 7/2007 |
| KR | 10-2015-0081869 A | 7/2015 |
| KR | 10-2015-0101418 | 9/2015 |
| KR | 10-2018-0012442 | 2/2018 |
| KR | 10-2018-0025427 A | 3/2018 |
| KR | 10-2018-0056497 A | 5/2018 |
| KR | 10-2019-0030840 A | 3/2019 |

* cited by examiner

DISPLAY DEVICE AND METHOD OF MANUFACTURING DISPLAY DEVICE

CROSS-REFERENCE TO RELATED APPLICATION(S)

This application claims priority to and benefits of Korean Patent Application No. 10-2019-0142684 under 35 U.S.C. §119, filed in the Korean Intellectual Property Office (KIPO) on Nov. 8, 2019, the entire contents of which are incorporated herein by reference.

BACKGROUND

Technical Field

Embodiments relate to a display device including a display substrate that includes a transistor and a capacitor, and a method of manufacturing the display device.

Description of the Related Art

Display devices are devices that display an image for providing visual information to a user. Recently, an organic light emitting display device has attracted attention among the display devices.

The organic light emitting display device has a self-luminous characteristics and, unlike a liquid crystal display device, does not require a separate light source, thereby reducing thickness and weight. The organic light emitting display device exhibits high quality characteristics such as low power consumption, high luminance, and high response speed.

In general, the organic light emitting display device may include multiple pixels. Each of the pixels may include a pixel circuit electrically connected to a gate line and a data line and an organic light emitting element electrically connected to the pixel circuit. Recently, with the development of high resolution display devices, the space for arranging the pixel circuit has become narrow.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device in which characteristics of a transistor and a capacitor may be improved.

Embodiments may provide a method of manufacturing a display device for reducing manufacturing cost and time.

A display device according to an embodiment may include a substrate, a first active layer disposed on the substrate, a first insulation layer disposed on the first active layer, and a first gate electrode disposed on the first insulation layer, the first gate electrode overlapping the first active layer. The display device may include a second insulation layer disposed on the first gate electrode, a second active layer disposed on the second insulation layer, and a first capacitor electrode disposed on the second insulation layer, the first capacitor electrode overlapping the first gate electrode. The display device may include a third insulation layer disposed on the second active layer and the first capacitor electrode, a second gate electrode disposed on the third insulation layer, the second gate electrode overlapping the second active layer, and a second capacitor electrode disposed on the third insulation layer, the second capacitor electrode overlapping the first gate electrode and electrically connected to the first capacitor electrode.

In an embodiment, the first capacitor electrode and the second active layer may include a same material.

In an embodiment, the first active layer may include polycrystalline silicon.

In an embodiment, the second insulation layer may include silicon nitride.

In an embodiment, a permittivity of the second insulation layer may be greater than a permittivity of the third insulation layer.

In an embodiment, the second active layer and the first capacitor electrode may each include an oxide semiconductor.

In an embodiment, the third insulation layer may include silicon oxide.

In an embodiment, a hydrogen content of the third insulation layer may be less than a hydrogen content of the second insulation layer.

In an embodiment, the second capacitor electrode may not overlap the first capacitor electrode.

In an embodiment, the second capacitor electrode may overlap the first capacitor electrode.

In an embodiment, the display device may further include a fourth insulation layer disposed on the second gate electrode and the second capacitor electrode and a connection electrode disposed on the fourth insulation layer, the connection electrode electrically connecting the second capacitor electrode and the first capacitor electrode.

In an embodiment, a constant voltage may be applied to the connection electrode.

In an embodiment, the display device may further include a first source electrode and a first drain electrode disposed on the fourth insulation layer and electrically connected to the first active layer and a second source electrode and a second drain electrode disposed on the fourth insulation layer and electrically connected to the second active layer. The connection electrode, the first source electrode, the first drain electrode, the second source electrode, and the second drain electrode may be disposed on a same layer.

In an embodiment, the display device may further include a pixel electrode electrically connected to the first source electrode or the first drain electrode, an emission layer disposed on the pixel electrode, and an opposite electrode disposed on the emission layer.

In an embodiment, the display device may further include a lower electrode disposed between the first insulation layer and the second insulation layer, the lower electrode overlapping the second active layer.

In an embodiment, the lower electrode may be electrically connected to the second gate electrode.

A method of manufacturing a display device according to an embodiment may include forming a first active layer on a substrate, forming a first insulation layer on the first active layer, forming a first gate electrode on the first insulation layer, the first gate electrode overlapping the first active layer, and forming a second insulation layer on the first gate electrode. The method may include forming a second active layer on the second insulation layer, forming a first capacitor electrode on the second insulation layer, the first capacitor electrode overlapping the first gate electrode, and forming a third insulation layer on the second active layer and the first capacitor electrode. The method may include forming a second gate electrode on the third insulation layer, the second gate electrode overlapping the second active layer, and forming a second capacitor electrode on the third insulation layer, the second capacitor electrode overlapping the first gate electrode and electrically connected to the first capacitor electrode.

In an embodiment, the forming of the second active layer and the forming of the first capacitor electrode may be simultaneously performed. The forming of the second gate electrode and the forming of the second capacitor electrode may be simultaneously performed.

In an embodiment, the forming of the second active layer and the first capacitor electrode may include forming an oxide semiconductor layer on the second insulation layer, etching the oxide semiconductor layer to form the second active layer and the first capacitor electrode, and injecting impurities into the second active layer and the first capacitor electrode using the second gate electrode and the second capacitor electrode as masks.

In an embodiment, the forming of the second gate electrode and the second capacitor electrode may include forming a conductive layer on the third insulation layer and etching the conductive layer to form the second gate electrode and the second capacitor electrode.

In an embodiment, the method may further include forming a fourth insulation layer on the second gate electrode and the second capacitor electrode, forming a first contact hole in the third insulation layer and the fourth insulation layer, the first contact hole exposing the first capacitor electrode, forming a second contact hole in the fourth insulation layer, the second contact hole exposing the second capacitor electrode, and forming a connection electrode on the fourth insulation layer, the connection electrode filling the first contact hole and the second contact hole.

In an embodiment, the forming of the first contact hole and the forming of the second contact hole are simultaneously performed.

In an embodiment, the method may further include forming a lower electrode between the first insulation layer and the second insulation layer, the lower electrode overlapping the second active layer.

In an embodiment, the forming of the first gate electrode and the forming of the lower electrode may be simultaneously performed.

A display device according to an embodiment may include a substrate, a first transistor including a first active layer disposed on the substrate, a first insulation layer disposed on the first active layer, and a first gate electrode disposed on the first insulation layer, the first gate electrode overlapping the first active layer. The display device may include a capacitor including the first gate electrode, a second insulation layer disposed on the first gate electrode, a first capacitor electrode disposed on the second insulation layer, the first capacitor electrode overlapping the first gate electrode, a third insulation layer disposed on the first capacitor electrode, and a second capacitor electrode disposed on the third insulation layer, the second capacitor electrode overlapping the first gate electrode and electrically connected to the first capacitor electrode. The display device may include a second transistor including a second active layer disposed between the second insulation layer and the third insulation layer, the second active layer and the first capacitor electrode including a same material, the third insulation layer, and a second gate electrode disposed on the third insulation layer, the second gate electrode overlapping the second active layer.

In an embodiment, the first active layer may include polycrystalline silicon.

In an embodiment, the second active layer and the first capacitor electrode may each include an oxide semiconductor.

In an embodiment, the second transistor may further include a lower electrode disposed between the first insulation layer and the second insulation layer, the lower electrode overlapping the second active layer.

In an embodiment, the lower electrode may be electrically connected to the second gate electrode.

A display device according to an embodiment may include a first active layer, a first gate electrode overlapping the first active layer, the first gate electrode being insulated from the first active layer, a first capacitor electrode overlapping a first portion of the first gate electrode, the first capacitor electrode being insulated from the first gate electrode. The display device may include a second active layer not overlapping the first gate electrode, the second active layer and the first capacitor electrode including a same material, a second gate electrode overlapping the second active layer, the second gate electrode being insulated from the second active layer, and a second capacitor electrode overlapping a second portion of the first gate electrode, the second capacitor electrode being insulated from the first gate electrode and electrically connected to the first capacitor electrode.

In an embodiment, the second capacitor electrode may not overlap the first capacitor electrode.

In an embodiment, the second capacitor electrode may overlap the first capacitor electrode.

In an embodiment, the display device may further include a connection electrode overlapping the first capacitor electrode and the second capacitor electrode, the connection electrode electrically connecting the second capacitor electrode and the first capacitor electrode.

The display device according to an embodiment may include the second transistor including the second active layer and the second gate electrode disposed with the third insulation layer in between and the capacitor including the first gate electrode and the first capacitor electrode disposed with the second insulation layer in between. Accordingly, a threshold voltage of the second transistor may decrease, and a capacitance of the capacitor may increase.

In the method of manufacturing the display device according to an embodiment, the second active layer of the second transistor and the first capacitor electrode of the capacitor may be substantially simultaneously disposed on the second insulation layer, so that the number of the photolithography processes for forming the second transistor and the capacitor may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
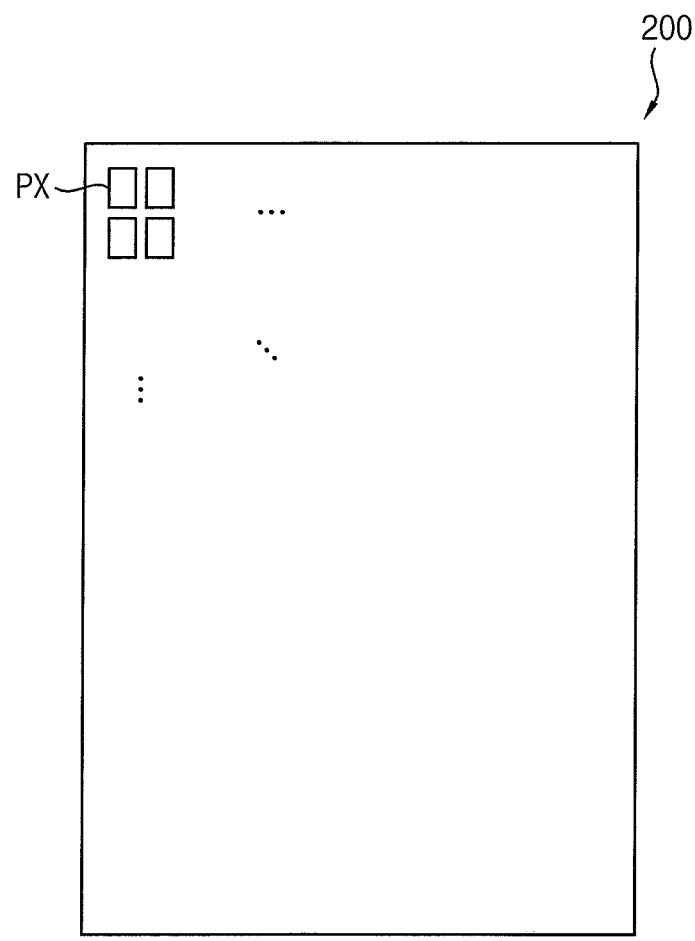
FIG. 1 is a schematic plan view illustrating a display device according to an embodiment of the invention.

Hereinafter, display devices and methods of manufacturing display devices in accordance with embodiments will be explained in detail with reference to the accompanying drawings.

In the drawing figures, dimensions may be exaggerated for clarity of illustration.

As used herein, the singular forms "a," "an," and "the" are intended to include the plural forms as well, unless the context clearly indicates otherwise. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The term overlap may include layer, stack, face or facing, extending over, extending under, covering or partly covering or any other suitable term as would be appreciated and understood by those of ordinary skill in the art. The phrase "does not overlap" may include "apart from" or "set aside from" or "offset from" and any other suitable equivalents as would be appreciated and understood by those of ordinary skill in the art.

The phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view illustrating a display device according to an embodiment of the invention.

Referring to FIG. 1, a display device 200 according to an embodiment of the invention may include multiple pixels PX. The pixels PX may be arranged as a substantial matrix form along a row direction and a column direction. The display device 200 may display an image that is a combination of light emitted from each of the pixels PX.

Figure 2:
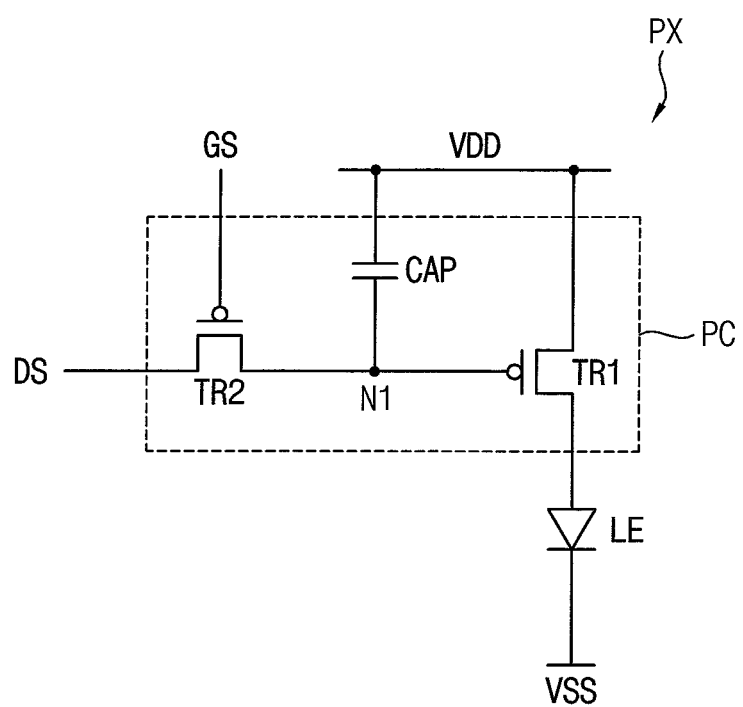
FIG. 2 is a schematic circuit diagram illustrating a pixel according to an embodiment of the invention.

FIG. 2 is a schematic circuit diagram illustrating a pixel according to an embodiment of the invention. For example, FIG. 2 may illustrate an example of the pixel PX illustrated in FIG. 1.

Referring to FIG. 2, a pixel PX according to an embodiment of the invention may include a pixel circuit PC and a light emitting element LE electrically connected to the pixel circuit PC. The pixel circuit PC may provide a driving current to the light emitting element LE. The light emitting element LE may emit light based on the driving current provided from the pixel circuit PC. The pixel circuit PC may include at least one transistor and at least one capacitor for generating the driving current.

In an embodiment, the pixel circuit PC may include a first transistor TR1, a second transistor TR2, and a capacitor CAP.

A gate electrode of the first transistor TR1 may be electrically connected to the first node N1. A first power voltage VDD may be applied to a source electrode of the first transistor TR1, and a drain electrode of the first transistor TR1 may be electrically connected to the light emitting element LE. The first transistor TR1 may generate the driving current based on a voltage between the gate electrode and the source electrode, and may transmit the driving current to the light emitting element LE.

A gate signal GS may be applied to a gate electrode of the second transistor TR2. A data signal DS may be applied to a source electrode of the second transistor TR2, and a drain electrode of the second transistor TR2 may be electrically connected to the first node N1. The second transistor TR2 may transmit the data signal DS to the first node N1 based on the gate signal GS.

The first power voltage VDD may be applied to a first electrode of the capacitor CAP, and a second electrode of the capacitor CAP may be electrically connected to the first node N1. The capacitor CAP may maintain the voltage between the gate electrode and the source electrode of the first transistor TR1 in case that the second transistor TR2 is turned off, so that the light emitting element LE may emit light.

A first electrode of the light emitting element LE may be electrically connected to the pixel circuit PC, and a second power voltage VSS may be applied to a second electrode of the light emitting element LE. In an embodiment, the second power voltage VSS may be less than the first power voltage VDD. The light emitting element LE may emit light based on the driving current transmitted from the pixel circuit PC.

Figure 3:
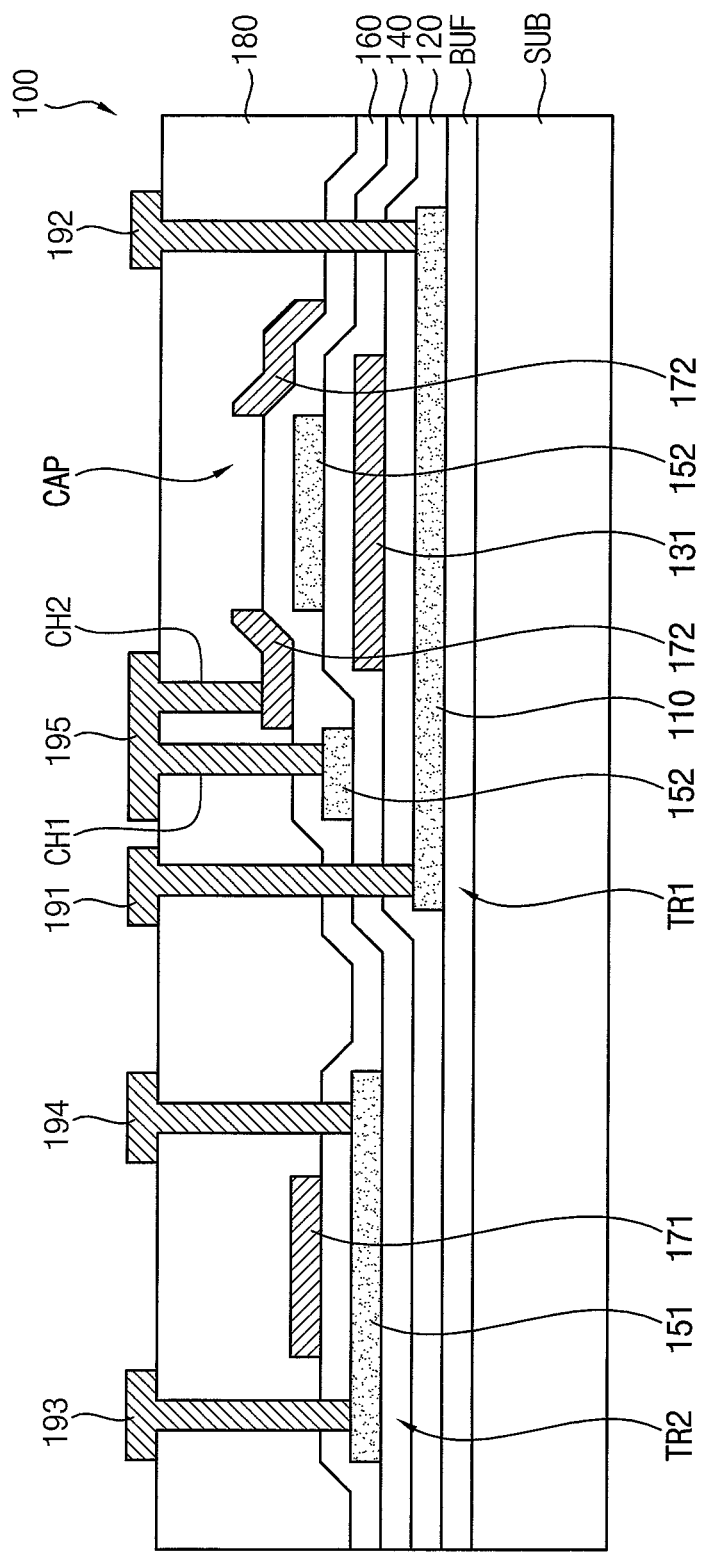
FIG. 3 is a schematic cross-sectional view illustrating a display substrate according to an embodiment of the invention.
Figure 4:
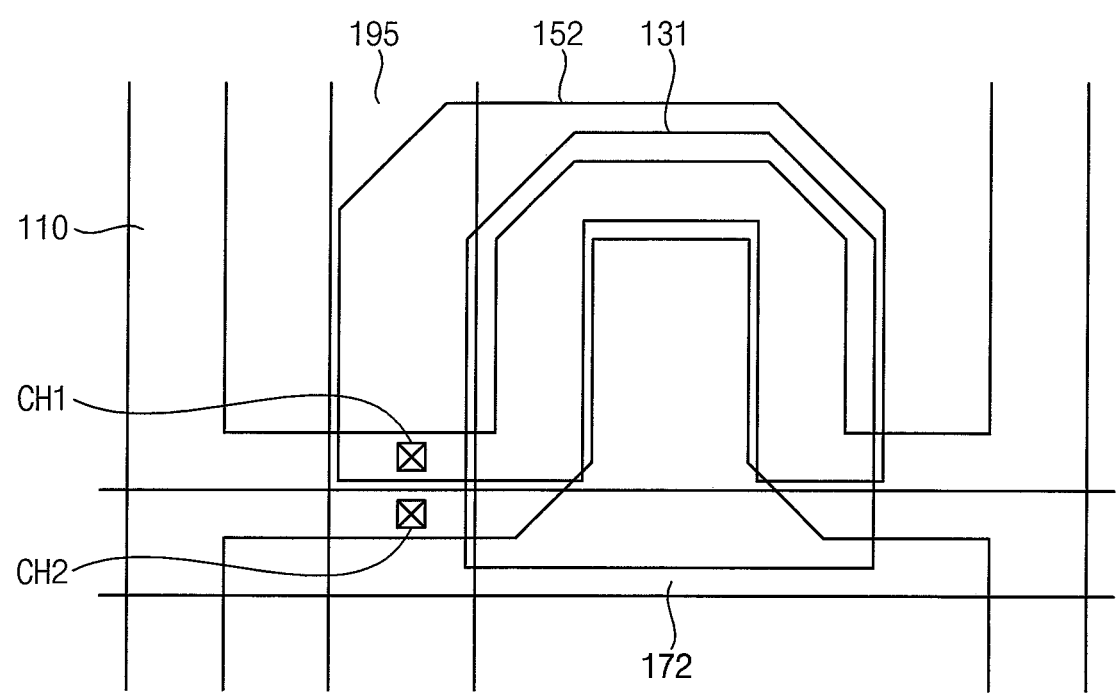
FIG. 4 is a schematic plan view illustrating a portion of the display substrate in FIG. 3.

FIG. 3 is a schematic cross-sectional view illustrating a display substrate according to an embodiment of the invention. For example, a display substrate illustrated in FIG. 3 may include the pixel circuit PC illustrated in FIG. 2. FIG. 4 is a schematic plan view illustrating a portion of the display substrate in FIG. 3. For example, FIG. 4 may illustrate the first transistor TR1 and the capacitor CAP illustrated in FIG. 3.

Referring to FIGS. 3 and 4, a display substrate 100 according to an embodiment of the invention may include a first transistor TR1, a second transistor TR2, and a capacitor CAP which may be disposed on a substrate SUB.

The substrate SUB may be an insulating substrate including glass, quartz, plastic, or the like, or a combination thereof. In an embodiment, the substrate SUB may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulation material such as polyimide (PI) or the like, and the first barrier layer and the second barrier layer may include an inorganic insulation material such as silicon oxide, silicon nitride, amorphous silicon, or the like, or a combination thereof.

A buffer layer BUF may be disposed on the substrate SUB. The buffer layer BUF may block impurities such as oxygen, moisture, or the like from being permeated above the substrate SUB through the substrate SUB. The buffer layer BUF may provide a planarized upper surface above the substrate SUB. The buffer layer BUF may include an inorganic insulation material such as silicon oxide, silicon nitride, silicon oxynitride, or the like, or a combination thereof.

A first active layer 110 may be disposed on the buffer layer BUF. In an embodiment, the first active layer 110 may include polycrystalline silicon.

The first active layer 110 may include a first source region, a first drain region, and a first channel region disposed between the first source region and the first drain region. The first source region and the first drain region may be doped with P-type or N-type impurities. The first channel region may have a curved shape such as 'S', 'U', or the like in a plan view. Accordingly, the first active layer 110 may have the first channel region having a relatively large length within a limited space. Therefore, a driving range of the first transistor TR1 including the first active layer 110 may increase.

A first insulation layer 120 may be disposed on the first active layer 110. The first insulation layer 120 may be disposed on the buffer layer BUF, and may cover the first active layer 110. The first insulation layer 120 may insulate a first gate electrode 131 disposed on the first active layer 110 from the first active layer 110. The first insulation layer 120 may include an inorganic insulation material such as silicon oxide, silicon nitride, silicon oxynitride, or the like, or a combination thereof.

The first gate electrode 131 may be disposed on the first insulation layer 120. The first gate electrode 131 may overlap the first channel region of the first active layer 110. The first gate electrode 131 may include a conductive material such as molybdenum (Mo), copper (Cu), or the like, or a combination thereof. The first active layer 110 including the first source region, the first drain region and the first channel region, the first insulation layer 120, and the first gate electrode 131 may form the first transistor TR1.

A second insulation layer 140 may be disposed on the first gate electrode 131. The second insulation layer 140 may be disposed on the first insulation layer 120, and may cover the first gate electrode 131. The second insulation layer 140 may insulate a first capacitor electrode 152 disposed on the first gate electrode 131 from the first gate electrode 131. In an embodiment, the second insulation layer 140 may include silicon nitride.

A second active layer 151 and a first capacitor electrode 152 may be disposed on the second insulation layer 140. The second active layer 151 may not overlap the first gate electrode 131. The first capacitor electrode 152 may be spaced apart from the second active layer 151, and may overlap the first gate electrode 131. Specifically, the first capacitor electrode 152 may overlap a first portion of the first gate electrode 131. The second active layer 151 and the first capacitor electrode 152 may include a substantially same material. In an embodiment, the second active layer 151 and the first capacitor electrode 152 may include an oxide semiconductor. For example, the oxide semiconductor may include indium gallium zinc oxide (IGZO), zinc tin oxide (ZTO), indium zinc oxide (IZO), or the like, or a combination thereof.

The second active layer 151 may include a second source region, a second drain region, and a second channel region disposed between the second source region and the second drain region. The second source region and the second drain region may be doped with P-type or N-type impurities. Further, the first capacitor electrode 152 may be doped with P-type or N-type impurities. For example, the first capacitor electrode 152 may be doped with impurities of the same type as those of the second source region and the second drain region of the second active layer 151. Since the first capacitor 152 may be doped with the impurities, the first capacitor electrode 152 may be conductive.

A third insulation layer 160 may be disposed on the second active layer 151 and the first capacitor electrode 152. A third insulation layer 160 may be disposed on the second insulation layer 140, and may cover the second active layer 151 and the first capacitor electrode 152. The third insulation layer 160 may insulate a second gate electrode 171 disposed on the second active layer 151 from the second active layer 151, and may insulate a second capacitor electrode 172 disposed on the first gate electrode 131 from the first gate electrode 131. In an embodiment, the third insulation layer 160 may include silicon oxide.

The second insulation layer 140 may have a relatively large permittivity. In an embodiment, a permittivity of the second insulation layer 140 may be greater than a permittivity of the third insulation layer 160. A permittivity of silicon nitride may be greater than a permittivity of silicon oxide, and the permittivity of the second insulation layer 140 may be greater than the permittivity of the third insulation layer 160 in case that the second insulation layer 140 and the third insulation layer 160 include silicon nitride and silicon oxide, respectively.

The third insulation layer 160 may have a relatively small hydrogen content. In an embodiment, a hydrogen content of the third insulation layer 160 may be less than a hydrogen content of the second insulation layer 140. A hydrogen content of silicon oxide may be less than a hydrogen content of silicon nitride, and the hydrogen content of the third insulation layer 160 may be less than the hydrogen content of the second insulation layer 140 in case that the second insulation layer 140 and the third insulation layer 160 include silicon nitride and silicon oxide, respectively.

The second insulation layer 140 may have a relatively small thickness, and the third insulation layer 160 may have a relatively large thickness. In an embodiment, a thickness of the second insulation layer 140 may be less than a thickness of the third insulation layer 160.

The second gate electrode 171 and the second capacitor electrode 172 may be disposed on the third insulation layer 160. The second gate electrode 171 may overlap the second channel region of the second active layer 151. The second capacitor electrode 172 may be spaced apart from the second gate electrode 171, and may overlap the first gate electrode 131. Specifically, the second capacitor electrode 172 may overlap a second portion of the first gate electrode 131 which may be different from the first portion of the first gate electrode 131. The second capacitor electrode 172 may be electrically connected to the first capacitor electrode 152. The second gate electrode 171 and the second capacitor electrode 172 may include a conductive material such as molybdenum (Mo), copper (Cu), or the like, or a combination thereof.

The second active layer 151 including the second source region, the second drain region and the second channel region, the third insulation layer 160, and the second gate electrode 171 may form the second transistor TR2. The third insulation layer 160 disposed between the second active layer 151 and the second gate electrode 171 may include silicon nitride having a relatively small hydrogen content and may have a relatively large thickness, so that a threshold voltage of the second transistor TR2 may be reduced. Accordingly, characteristics of the second transistor TR2 may be improved.

In an embodiment, the second capacitor electrode 172 may not overlap the first capacitor electrode 152. The second capacitor electrode 172 may be used as a mask in case that impurities may be injected into the first capacitor electrode 152, and the impurities may not be injected into a portion of the first capacitor electrode 152 which overlaps the second capacitor electrode 172. However, the impurities may be injected into an entirety of the first capacitor electrode 152 since the second capacitor electrode 172 does not overlap the first capacitor electrode 152. Therefore, a conductivity of the first capacitor electrode 152 may increase, and the first capacitor electrode 152 may function as an electrode of the capacitor CAP.

The first gate electrode 131, the second insulation layer 140, and the first capacitor electrode 152, the third insulation layer 160, and the second capacitor electrode 172 may form the capacitor CAP. The first gate electrode 131 may function as a lower capacitor electrode, and the first capacitor electrode 152 and the second capacitor electrode 172 electrically connected to each other may function as an upper capacitor electrode. Further, the second insulation layer 140 may function as a first dielectric layer between the first gate electrode 131 and the first capacitor electrode 152, and the second insulation layer 140 and the third insulation layer 160 may function as a second dielectric layer between the first gate electrode 131 and the second capacitor electrode 172. The second insulation layer 140 disposed between the first gate electrode 131 and the first capacitor electrode 152 may include silicon nitride having a relatively large permittivity and may have a relatively small thickness, so that a capacitance of the capacitor CAP may increase. Accordingly, characteristics of the capacitor CAP may be improved.

A fourth insulation layer 180 may be disposed on the second gate electrode 171 and the second capacitor electrode 172. The fourth insulation layer 180 may be disposed on the third insulation layer 160, and may cover the second gate electrode 171 and the second capacitor electrode 172. The fourth insulation layer 180 may include an inorganic insulation material such as silicon oxide, silicon nitride, silicon oxynitride or the like, or a combination thereof, and/or an organic insulation material such as polyimide (PI) or the like.

A first source electrode 191, a first drain electrode 192, a second source electrode 193, a second drain electrode 194, and a connection electrode 195 may be disposed on the fourth insulation layer 180. The first source electrode 191 and the first drain electrode 192 may be electrically connected to the source region and the drain region of the first active layer 110, respectively. The second source electrode 193 and the second drain electrode 194 may be electrically connected to the source region and the drain region of the second active layer 151, respectively. The connection electrode 195 may overlap the first capacitor electrode 152 and the second capacitor electrode 172, and may connect the second capacitor electrode 172 to the first capacitor electrode 152. The connection electrode 195 may contact the first capacitor electrode 152 through a first contact hole CH1 disposed (e.g., formed) in the third insulation layer 160 and the fourth insulation layer 180, and may contact the second capacitor electrode 172 through a second contact hole CH2 disposed in the fourth insulation layer 180. The first source electrode 191, the first drain electrode 192, the second source electrode 193, the second drain electrode 194, and the connection electrode 195 may include a conductive material such as aluminum (Al), titanium (Ti), copper (Cu), or the like, or a combination thereof.

In an embodiment, a constant voltage may be applied to the connection electrode 195. For example, the first power voltage VDD illustrated in FIG. 2 may be applied to the connection electrode 195. Accordingly, the first power voltage VDD may be applied to the first capacitor electrode 152 and the second capacitor electrode 172 of the capacitor CAP which may be electrically connected to the connection electrode 195.

FIGS. 5, 6, 7, 8, 9, 10, 11, and 12 are schematic diagrams illustrating a method of manufacturing a display substrate according to an embodiment of the invention. For example, FIGS. 5, 6, 7, 8, 9, 10, 11, and 12 may illustrate a method of manufacturing the display substrate 100 in FIGS. 3 and 4.

Figure 5:
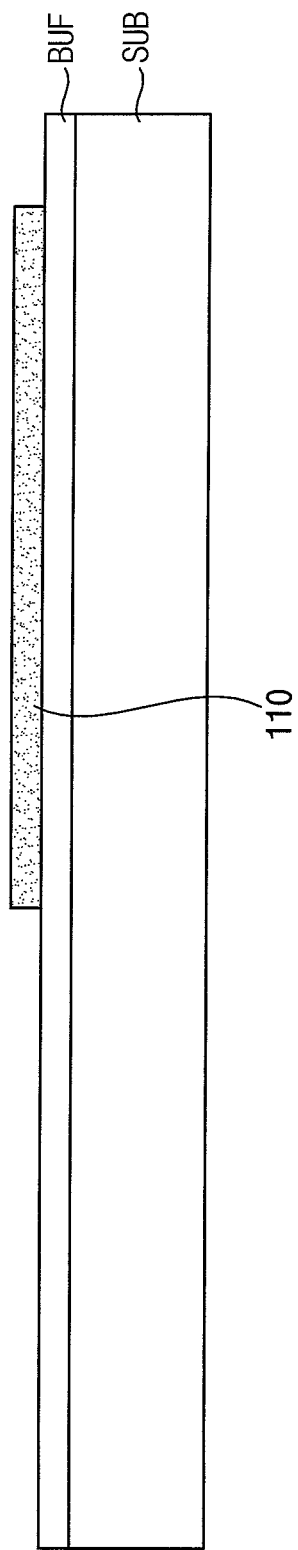
FIGS. 5, 6, 7, 8, 9, 10, 11, and 12 are schematic diagrams illustrating a method of manufacturing a display substrate according to an embodiment of the invention.
Figure 6:
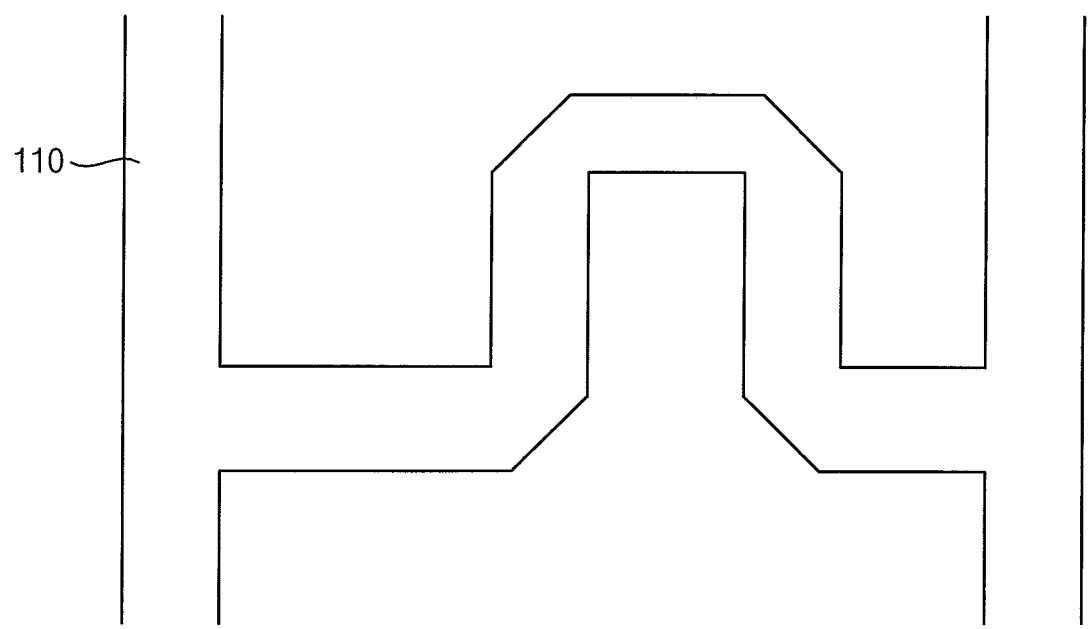

Referring to FIGS. 5 and 6, the first active layer 110 may be disposed (e.g. formed) on the substrate SUB.

The buffer layer BUF may be disposed on the substrate SUB. For example, an inorganic insulation material such as silicon nitride, silicon oxide, silicon oxynitride, or the like, or a combination thereof may be deposited on the substrate SUB using a chemical vapor deposition such as PECVD or the like to form the buffer layer BUF.

The first active layer 110 may be disposed on the buffer layer BUF. For example, amorphous silicon may be deposited on the buffer layer BUF using a chemical vapor deposition such as PECVD or the like to form an amorphous silicon layer, and the amorphous silicon layer may be crystallized by an excimer layer or the like to form a polycrystalline silicon layer. The polycrystalline silicon layer may be etched to form the first active layer 110.

Figure 7:
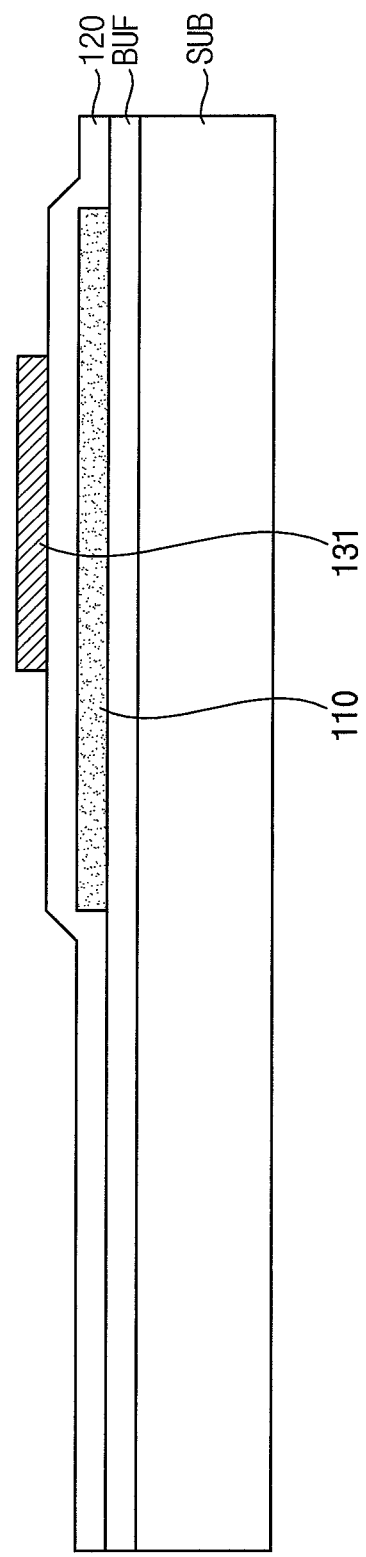
Figure 8:
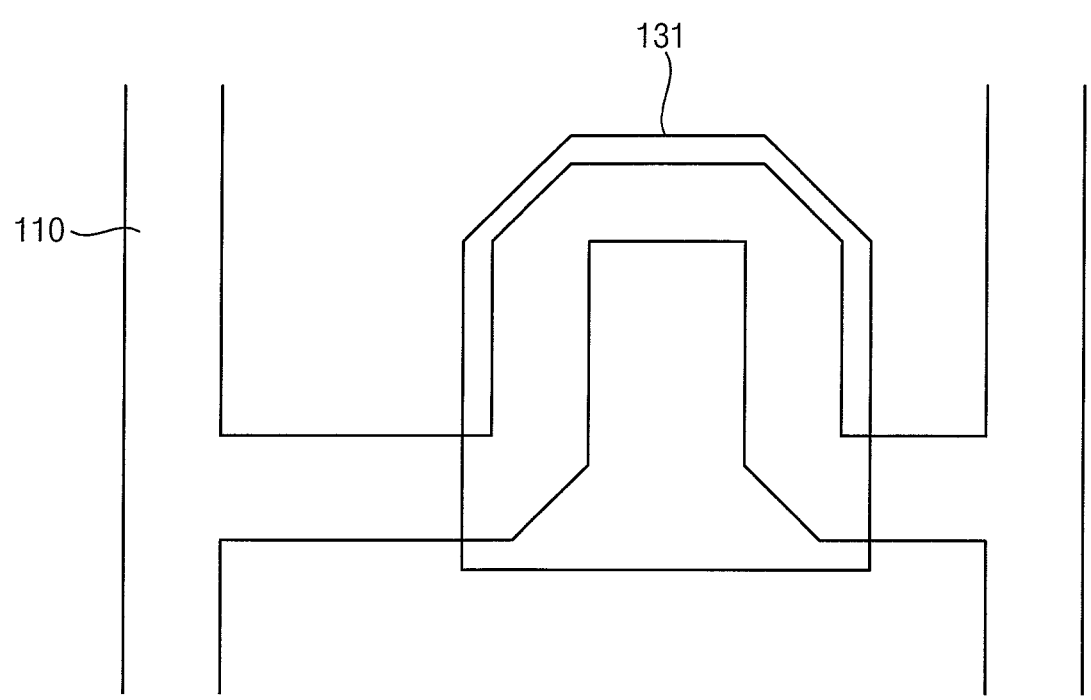

Referring to FIGS. 7 and 8, the first insulation layer 120 may be disposed on the first active layer 110, and the first gate electrode 131 may be disposed on the first insulation layer 120.

The first insulation layer 120 may be disposed on the first active layer 110. For example, an inorganic insulation material such as silicon nitride, silicon oxide, silicon oxynitride, or the like, or a combination thereof may be deposited on the first active layer 110 using a chemical vapor deposition such as PECVD or the like to form the first insulation layer 120.

The first gate electrode 131 may be disposed on the first insulation layer 120. For example, a conductive material such as molybdenum (Mo), copper (Cu), or the like, or a combination thereof may be deposited on the first insulation layer 120 using a physical vapor deposition such as sputtering or the like to form a conductive layer, and the conductive layer may be etched to form the first gate electrode 131. The first gate electrode 131 may overlap (e.g., overlap a portion of) the first active layer 110.

Impurities may be injected into the first active layer 110. The first gate electrode 131 overlapping the portion of the first active layer 110 may be used as a mask to inject the impurities into the first active layer 110. Accordingly, the impurities may be injected into a portion of the first active layer 110 which does not overlap the first gate electrode 131 to form the first source region and the first drain region, and the impurities may not be injected into a portion of the first active layer 110 which overlaps the first gate electrode 131 to form the first channel region.

Figure 9:
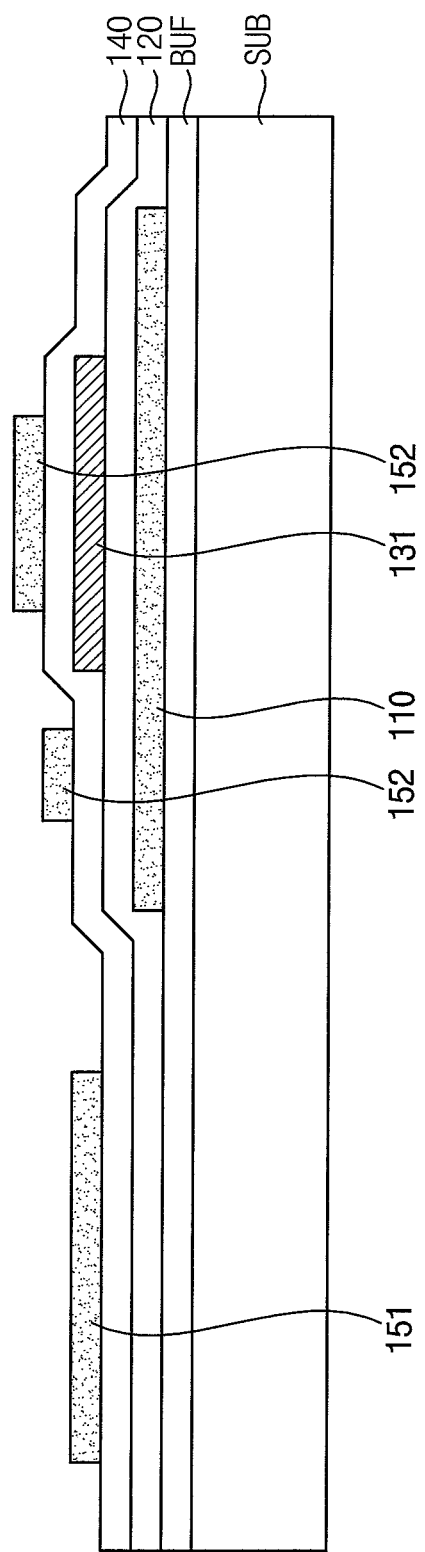
Figure 10:
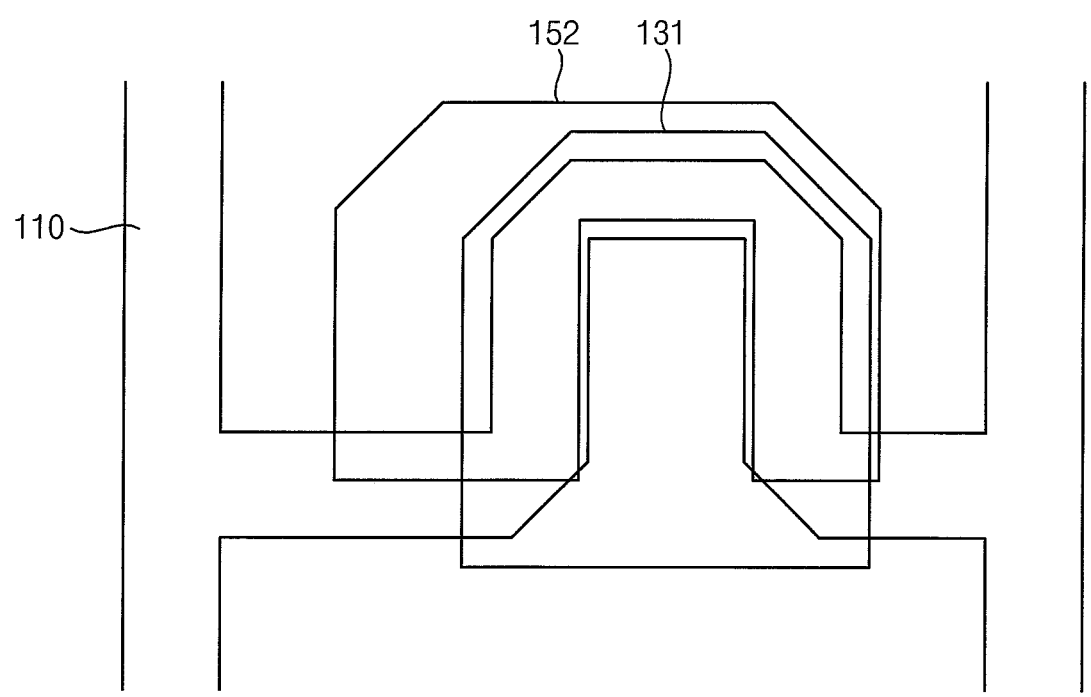

Referring to FIGS. 9 and 10, the second insulation layer 140 may be disposed on the first gate electrode 131, and the second active layer 151 and the first capacitor electrode 152 may be disposed (e.g., substantially simultaneously disposed) on the second insulation layer 140.

The second insulation layer 140 may be disposed on the first gate electrode 131. For example, silicon nitride may be deposited on the first gate electrode 131 using a chemical vapor deposition such as PECVD or the like to form the second insulation layer 140.

The second active layer 151 and the first capacitor electrode 152 may be disposed on the second insulation layer 140. For example, an oxide semiconductor such as indium gallium zinc oxide (IGZO), zinc tin oxide (ZTO), indium zinc oxide (IZO), or the like may be deposited on the second insulation layer 140 using a chemical vapor deposition such as PECVD or the like to form an oxide semiconductor layer, and the oxide semiconductor layer may be etched to form the second active layer 151 and the first capacitor electrode 152. The first capacitor electrode 152 may overlap the first gate electrode 131.

Since the second active layer 151 and the first capacitor electrode 152 may be substantially simultaneously disposed on the second insulation layer 140, an additional process for forming the first capacitor electrode 152 may not be required. Accordingly, the number of the photolithography processes for forming the second transistor TR2 and the capacitor CAP may be reduced.

Figure 11:
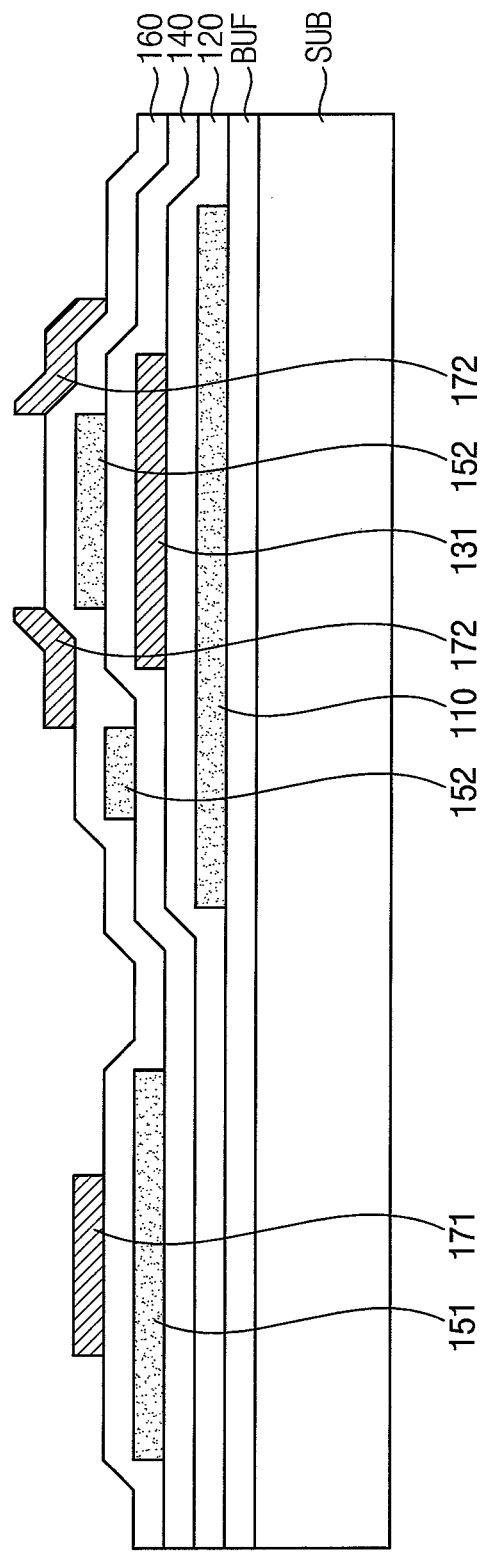
Figure 12:
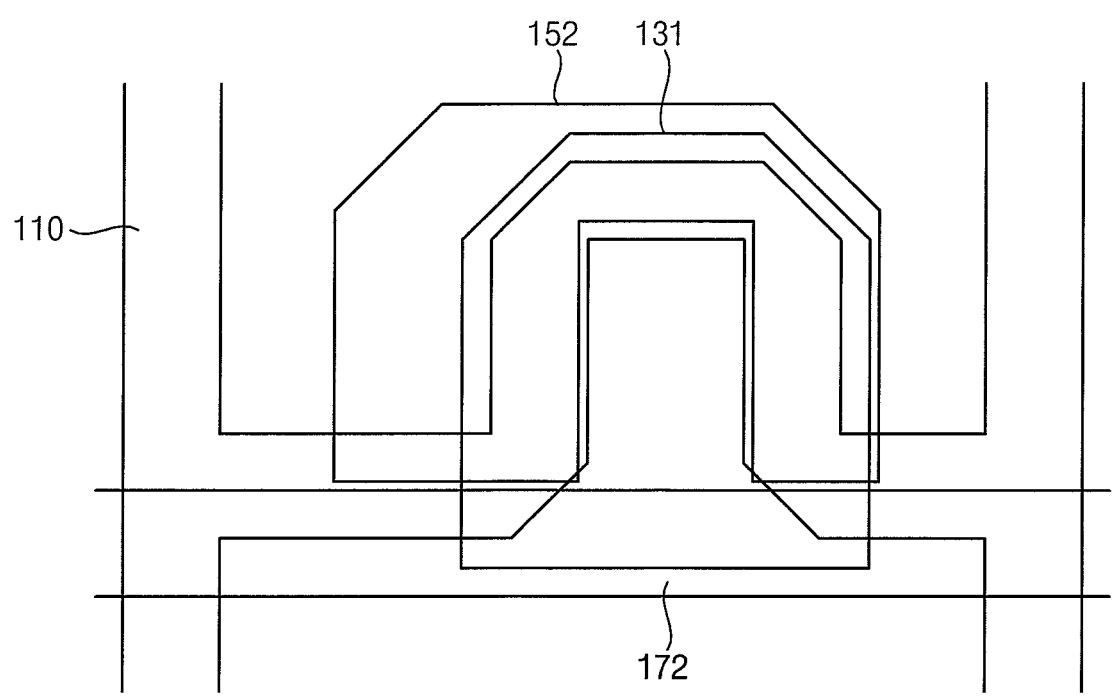

Referring to FIGS. 11 and 12, the third insulation layer 160 may be disposed on the second active layer 151 and the first capacitor electrode 152, and the second gate electrode 171 and the second capacitor electrode 172 may be disposed (e.g., substantially simultaneously disposed) on the third insulation layer 160.

The third insulation layer 160 may be disposed on the second active layer 151 and the first capacitor electrode 152. For example, silicon oxide may be deposited on the second active layer 151 and the first capacitor electrode 152 using a chemical vapor deposition such as PECVD or the like to form the third insulation layer 160.

The second gate electrode 171 and the second capacitor electrode 172 may be disposed on the third insulation layer 160. For example, a conductive material such as molybdenum (Mo), copper (Cu), or the like, or a combination thereof may be deposited on the third insulation layer 160 using a physical vapor deposition such as sputtering or the like to form a conductive layer, and the conductive layer may be etched to form the second gate electrode 171 and the second capacitor electrode 172. The second gate electrode 171 may overlap (e.g., overlap a portion of) the second active layer 151. The second capacitor electrode 172 may overlap the first gate electrode 131, and may not overlap the first capacitor electrode 152.

Impurities may be injected into the second active layer 151 and the first capacitor electrode 152. The second gate electrode 171 overlapping the portion of the second active layer 151 and the second capacitor electrode 172 not overlapping the first capacitor electrode 152 may be used as masks to inject the impurities into the second active layer 151 and the first capacitor electrode 152. Accordingly, the impurities may be injected into a portion of the second active layer 151 which does not overlap the second gate electrode 171 to form the second source region and the second drain region, and the impurities may not be injected into a portion of the second active layer 151 which overlaps the second gate electrode 171 to form the second channel region. Further, the impurities may be injected into an entirety of the first capacitor electrode 152 which does not overlap the second capacitor electrode 172, so that the first capacitor electrode 152 may become conductive.

Since the second gate electrode 171 and the second capacitor electrode 172 may be substantially simultaneously disposed on the third insulation layer 160, an additional process for forming the second gate electrode 171 may not be required. Accordingly, the number of the photolithography processes for forming the second transistor TR2 and the capacitor CAP may be reduced.

Referring to FIGS. 3 and 4, the fourth insulation layer 180 may be disposed on the second gate electrode 171 and the second capacitor electrode 172, and the first source electrode 191, the first drain electrode 192, the second source electrode 193, the second drain electrode 194, and the connection electrode 195 may be disposed (e.g., substantially simultaneously disposed) on the fourth insulation layer 180.

The fourth insulation layer 180 may be disposed on the second gate electrode 171 and the second capacitor electrode 172. For example, an inorganic insulation material such as silicon nitride, silicon oxide, silicon oxynitride, or the like, or a combination thereof may be deposited, or an organic insulation material such as polyimide or the like may be coated, on the second gate electrode 171 and the second capacitor electrode 172 to form the fourth insulation layer 180.

Contact holes passing through the fourth insulation layer 180 may be disposed (e.g., formed). For example, the first insulation layer 120, the second insulation layer 140, the third insulation layer 160, and the fourth insulation layer 180 may be etched using a first mask to form contact holes respectively overlapping the source region and the drain region of the first active layer 110. Further, the third insulation layer 160 and the fourth insulation layer 180 may be etched using a second mask to form contact holes respectively overlapping the source region and the drain region of the second active layer 151. A first contact hole CH1 overlapping the first capacitor electrode 152 may be disposed by etching the third insulation layer 160 and the fourth insulation layer 180 using the second mask, and a second contact hole CH2 overlapping the second capacitor electrode 172 may be disposed by etching the fourth insulation layer 180 using the second mask. In other words, the first contact hole CH1 and the second contact hole CH2 may be substantially simultaneously disposed with the contact holes respectively overlapping the source region and the drain region of the second active layer 151.

The first source electrode 191, the first drain electrode 192, the second source electrode 193, the second drain electrode 194, and the connection electrode 195 may be disposed on the fourth insulation layer 180. For example, a conductive material such as aluminum (Al), titanium (Ti), copper (Cu), or the like or a combination thereof may be deposited on the fourth insulation layer 180 using a physical vapor deposition such as sputtering or the like to form a conductive layer, and the conductive layer may be etched to form the first source electrode 191, the first drain electrode 192, the second source electrode 193, the second drain electrode 194, and the connection electrode 195. The first source electrode 191 and the first drain electrode 192 may fill the contact holes passing through the first insulation layer 120, the second insulation layer 140, the third insulation layer 160 and the fourth insulation layer 180, and may be respectively electrically connected to the source region and the drain region of the first active layer 110. The second source electrode 193 and the second drain electrode 194 may fill the contact holes passing through the third insulation layer 160 and the fourth insulation layer 180, and may be respectively electrically connected to the source region and the drain region of the second active layer 151. The connection electrode 195 may fill the first contact hole CH1 passing through the third insulation layer 160 and the fourth insulation layer 180 and the second contact hole CH2 passing through the fourth insulation layer 180, and may be electrically connected to the first capacitor electrode 152 and the second capacitor electrode 172. The connection electrode 195 may contact the first capacitor electrode 152 and the second capacitor electrode 172 through the first contact hole CH1 and the second contact hole CH2, respectively, so that the second capacitor electrode 172 may be electrically connected to the first capacitor electrode 152.

Figure 13:
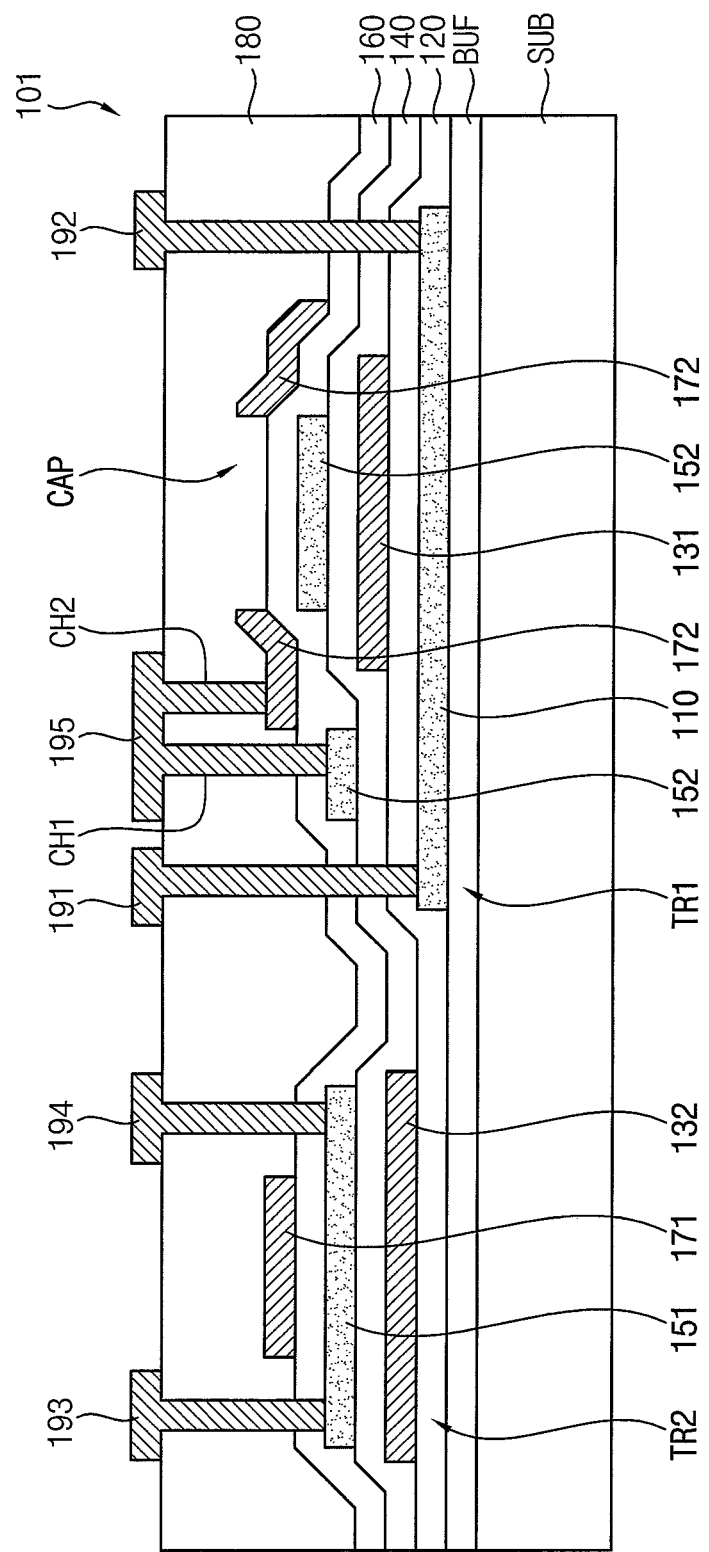
FIG. 13 is a schematic cross-sectional view illustrating a display substrate according to an embodiment of the invention.

FIG. 13 is a schematic cross-sectional view illustrating a display substrate according to an embodiment of the invention. For example, a display substrate illustrated in FIG. 13 may include the pixel circuit PC illustrated in FIG. 2.

Referring to FIG. 13, a display substrate 101 according to an embodiment of the invention may include a first transistor TR1, a second transistor TR2, and a capacitor CAP which may be disposed on a substrate SUB. The display substrate 101 described with reference to FIG. 13 may be substantially the same as or similar to the display substrate 100 described with reference to FIG. 3 except for further including a lower electrode 132. Accordingly, descriptions about elements of the display substrate 101 described with reference to FIG. 13, which may be substantially the same as or similar to those of the display substrate 100 described with reference to FIG. 3, will be omitted.

A lower electrode 132 may be disposed between the first insulation layer 120 and the second insulation layer 140. The lower electrode 132 may overlap the second active layer 151. The lower electrode 132 and the first gate electrode 131 may include a substantially same material.

In an embodiment, the lower electrode 132 may be electrically connected to the second gate electrode 171. In such an embodiment, the lower electrode 132 may function as a lower gate electrode of the second transistor TR2, and the second gate electrode 171 may function as an upper gate electrode of the second transistor TR2. In other words, the second transistor TR2 may have a dual-gate structure.

In an embodiment, an electrical signal may not be applied to the lower electrode 132, and the lower electrode 132 may function as a light shielding layer for blocking light incident toward the second active layer 151 from under the display substrate 101. Leakage current may occur in case that the second active layer 151 is irradiated with light, so that a reliability of the second transistor TR2 may be reduced. Light incident toward the second active layer 151 may be blocked in case that the lower electrode 132 overlapping the second active layer 151 is disposed between the first insulation layer 120 and the second insulation layer 140, so that the leakage current may decrease.

Figure 14:
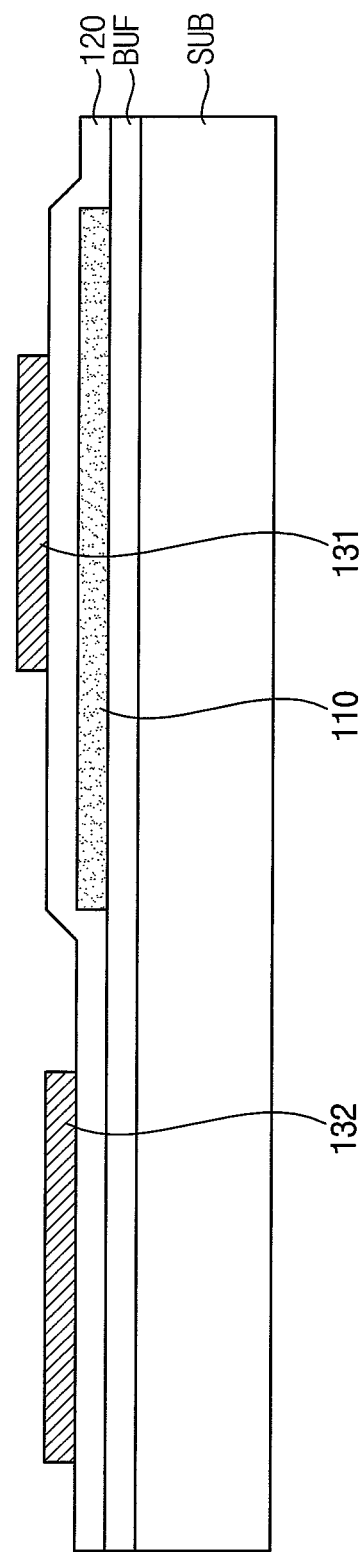
FIG. 14 is a schematic cross-sectional view illustrating a method of manufacturing a display substrate according to an embodiment of the invention.

FIG. 14 is a schematic cross-sectional view illustrating a method of manufacturing a display substrate according to an embodiment of the invention. For example, FIG. 14 may illustrate a method of manufacturing the display substrate 101 in FIG. 13.

A method of manufacturing the display substrate 101 described with reference to FIG. 14 may be substantially the same as or similar to the method of manufacturing the display substrate 100 described with reference to FIGS. 3 to 12 except for further forming the lower electrode 132. Accordingly, descriptions about elements of the method of manufacturing the display substrate 101 described with reference to FIG. 14, which may be substantially the same as or similar to those of the method of manufacturing the display substrate 100 described with reference to FIGS. 3 to 12, will be omitted.

Referring to FIG. 14, the first insulation layer 120 may be disposed on the first active layer 110, and the first gate electrode 131 and the lower electrode 132 may be disposed (e.g., substantially simultaneously disposed) on the first insulation layer 120.

The first insulation layer 120 may be disposed on the first active layer 110. The first gate electrode 131 and the lower electrode 132 may be disposed on the first insulation layer 120. For example, a conductive material such as molybdenum (Mo), copper (Cu), or the like, or a combination thereof may be deposited on the first insulation layer 120 using a physical vapor deposition such as sputtering or the like to form a conductive layer, and the conductive layer may be etched to form the first gate electrode 131 and the lower electrode 132. The first gate electrode 131 may overlap (e.g., overlap a portion of) the first active layer 110. Impurities may be injected into the first active layer 110.

Figure 15:
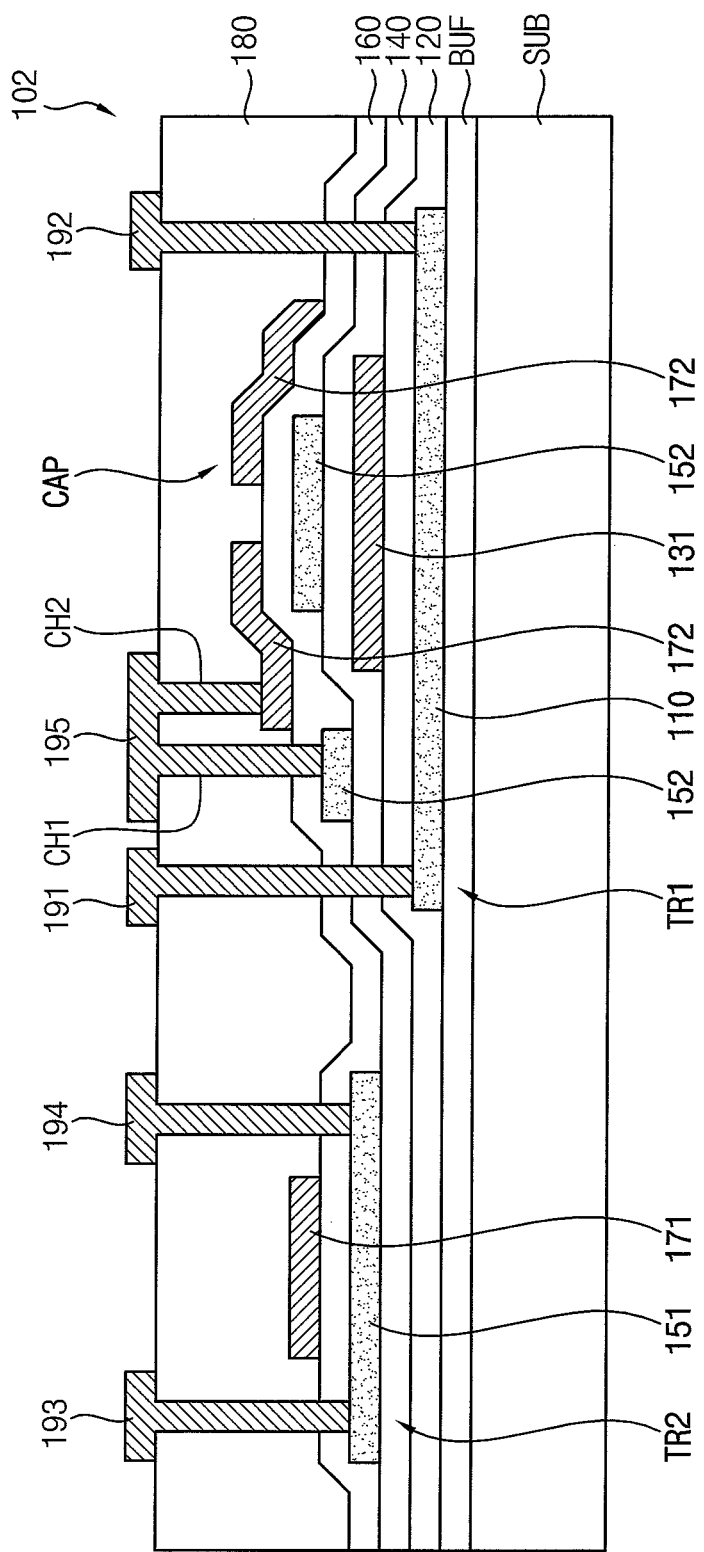
FIG. 15 is a schematic cross-sectional view illustrating a display substrate according to an embodiment of the invention.

FIG. 15 is a schematic cross-sectional view illustrating a display substrate according to an embodiment of the invention. For example, a display substrate illustrated in FIG. 15 may include the pixel circuit PC illustrated in FIG. 2.

Referring to FIG. 15, a display substrate 102 according to an embodiment of the invention may include a first transistor TR1, a second transistor TR2, and a capacitor CAP which may be disposed on a substrate SUB. The display substrate 102 described with reference to FIG. 15 may be substantially the same as or similar to the display substrate 100 described with reference to FIG. 3 except for the second capacitor electrode 172. Accordingly, descriptions about elements of the display substrate 102 described with reference to FIG. 15, which may be substantially the same as or similar to those of the display substrate 100 described with reference to FIG. 3, will be omitted.

In an embodiment, the second capacitor electrode 172 may overlap the first capacitor electrode 152. For example, the second capacitor electrode 172 may partially overlap the first capacitor electrode 152. Impurities may not be injected into a portion of the first capacitor electrode 152 which overlaps the second capacitor electrode 172 in case that the impurities are injected into the first capacitor electrode 152. However, since the second capacitor electrode 172 overlaps the first capacitor electrode 152, the planar area of the capacitor CAP may be reduced, and the resolution of the display substrate 102 may increase.

Figure 16:
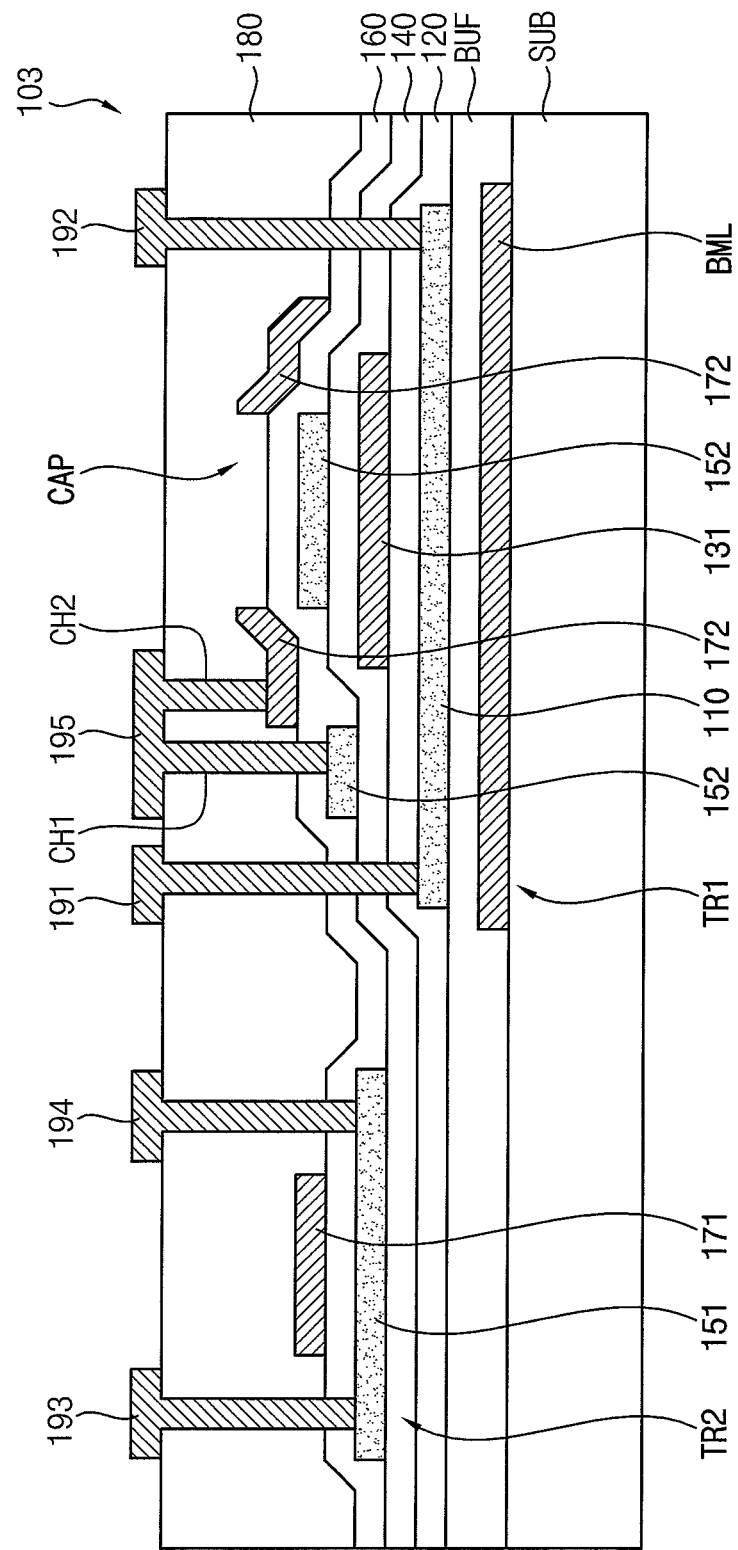
FIG. 16 is a schematic cross-sectional view illustrating a display substrate according to an embodiment of the invention.

FIG. 16 is a schematic cross-sectional view illustrating a display substrate according to an embodiment of the invention. For example, a display substrate illustrated in FIG. 16 may include the pixel circuit PC illustrated in FIG. 2.

Referring to FIG. 16, a display substrate 103 according to an embodiment of the invention may include a first transistor TR1, a second transistor TR2, and a capacitor CAP which may be disposed on a substrate SUB. The display substrate 103 described with reference to FIG. 16 may be substantially the same as or similar to the display substrate 100 described with reference to FIG. 3 except for further including a lower electrode BML. Accordingly, descriptions about elements of the display substrate 103 described with reference to FIG. 16, which may be substantially the same as or similar to those of the display substrate 100 described with reference to FIG. 3, will be omitted.

A lower electrode BML may be disposed between the substrate SUB and the buffer layer BUF. The lower electrode BML may overlap the first active layer 110. The lower electrode BML may include a conductive material such as molybdenum (Mo), copper (Cu), or the like, or a combination thereof.

In an embodiment, the lower electrode BML may be electrically connected to the first gate electrode 131. In such an embodiment, the lower electrode BML may function as a lower gate electrode of the first transistor TR1, and the first gate electrode 131 may function as an upper gate electrode of the first transistor TR1. In other words, the first transistor TR1 may have a dual-gate structure.

In an embodiment, an electrical signal may not be applied to the lower electrode BML, and the lower electrode BML may function as a light shielding layer for blocking light incident toward the first active layer 110 from under the display substrate 103. Leakage current may occur in case that the first active layer 110 is irradiated with light, so that reliability of the first transistor TR1 may be reduced. Light incident toward the first active layer 110 may be blocked in case that the lower electrode BML overlapping the first active layer 110 is disposed between the substrate SUB and the buffer layer BUF, so that the leakage current may decrease.

Figure 17:
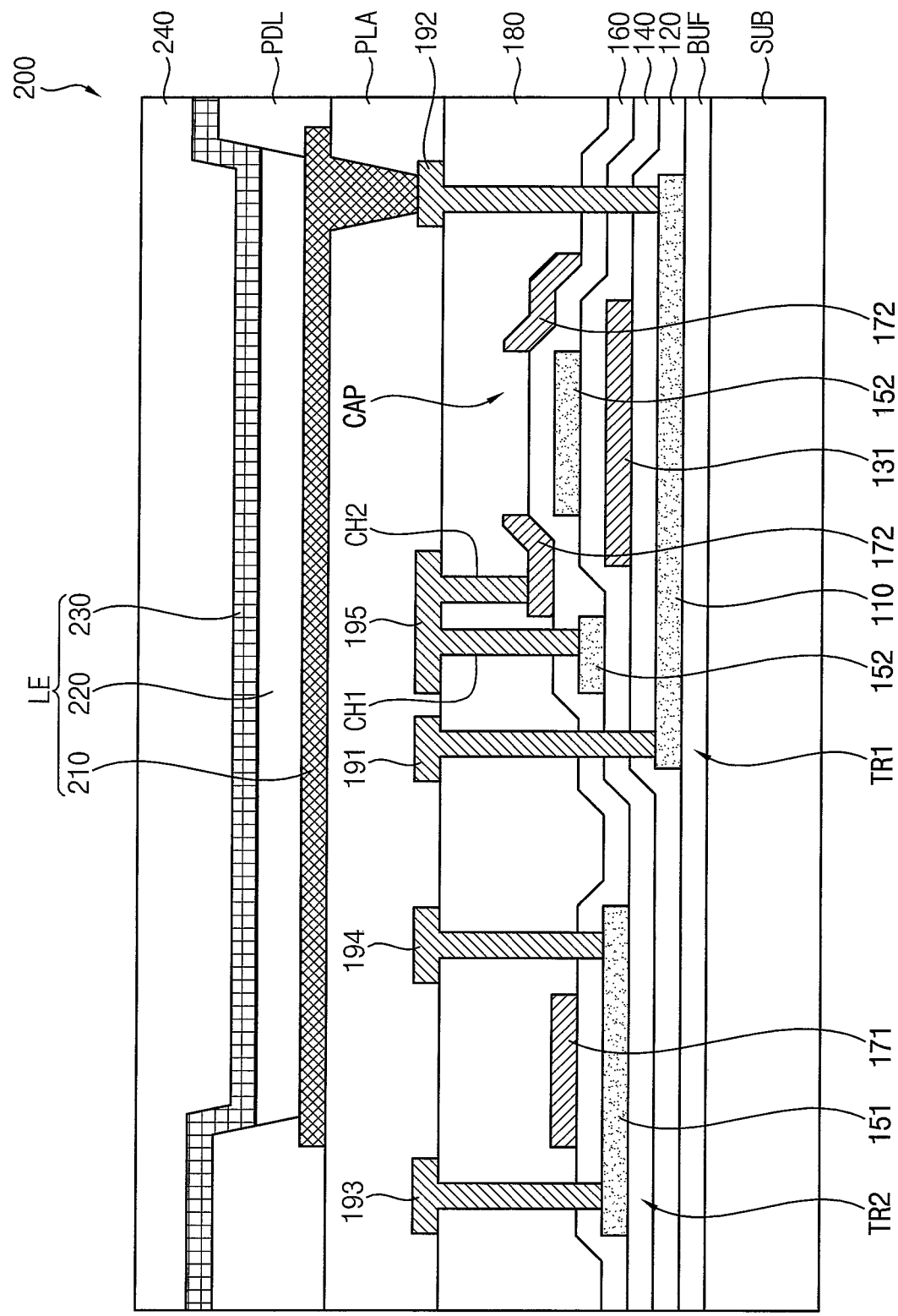
FIG. 17 is a schematic cross-sectional view illustrating a display device according to an embodiment of the invention.

FIG. 17 is a schematic cross-sectional view illustrating a display device according to an embodiment of the invention. For example, a display device illustrated in FIG. 17 may be the display device 200 of FIG. 1 and may include the pixel circuit PC and the light emitting element LE illustrated in FIG. 2.

Referring to FIG. 17, a display device 200 according to an embodiment of the invention may include a first transistor TR1, a second transistor TR2, a capacitor CAP, and a light emitting element LE which may be disposed on a substrate SUB. FIG. 17 illustrates the display device 200 including the display substrate 100 illustrated in FIG. 3, however, the invention is not limited thereto, and the display device 200 may include the display substrate 101 illustrated in FIG. 13, the display substrate 102 illustrated in FIG. 15, or the display substrate 103 illustrated in FIG. 16.

A planarization layer PLA may be disposed on the first source electrode 191, the first drain electrode 192, the second source electrode 193, the second drain electrode 194, and the connection electrode 195. The planarization layer PLA may be disposed on the fourth insulation layer 180, and may cover the first source electrode 191, the first drain electrode 192, the second source electrode 193, the second drain electrode 194, and the connection electrode 195. The planarization layer PLA may provide a planarized upper surface above the display substrate. The planarization layer PLA may include an inorganic insulation material such as silicon oxide, silicon nitride, silicon oxynitride or the like, or a combination thereof and/or an organic insulation material such as polyimide (PI) or the like.

A pixel electrode 210 may be disposed on the planarization layer PLA. The pixel electrode 210 may be electrically connected to the first source electrode 191 or the first drain electrode 192. The pixel electrode 210 may contact the first source electrode 191 or the first drain electrode 192 through a contact hole disposed in the planarization layer PLA. The pixel electrode 210 may include a conductive material such as metal, alloy, transparent conductive oxide, or the like, or a combination thereof. For example, the pixel electrode 210 may include silver (Ag), indium tin oxide (ITO), or the like, or a combination thereof.

A pixel defining layer PDL may be disposed on the pixel electrode 210. The pixel defining layer PDL may be disposed on the planarization layer PLA, and may cover the pixel electrode 210. The pixel defining layer PDL may have a pixel opening that exposes at least a portion of the pixel electrode 210. In an embodiment, the pixel opening may expose a central portion of the pixel electrode 210, and the pixel defining layer PDL may cover a peripheral portion of the pixel electrode 210. The pixel defining layer PDL may include an organic insulation material such as polyimide (PI) or the like.

An emission layer 220 may be disposed on the pixel electrode 210. The emission layer 220 may be disposed on the pixel electrode 210 exposed by the pixel opening. The emission layer 220 may include at least one of an organic light emitting material and a quantum dot.

In an embodiment, the organic light emitting material may include a low molecular organic compound or a high molecular organic compound. For example, the low molecular organic compound may include copper phthalocyanine, diphenylbenzidine (N, N'-diphenylbenzidine), trihydroxyquinoline aluminum (tris-(8-hydroxyquinoline)aluminum), and the like, or a combination thereof. The high molecular organic compound may include poly ethylenedioxythiophene (poly(3,4-ethylenedioxythiophene), polyaniline, polyphenylenevinylene, polyfluorene, and the like, or a combination thereof.

In an embodiment, the quantum dot may include a core including a group II-VI compound, a group III-V compound, a group IV-VI compound, a group IV element, a group IV compound, or a combination thereof. In one embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

The opposite electrode 230 may be disposed on the emission layer 220. In an embodiment, the opposite electrode 230 may also be disposed on the pixel defining layer PDL. The opposite electrode 230 may include a conductive material such as metal, alloy, transparent conductive oxide, or the like, or a combination thereof. For example, the opposite electrode 230 may include aluminum (Al), platinum (Pt), silver (Ag), magnesium (Mg), gold (Au), chromium (Cr), tungsten (W), titanium (Ti), or the like, or a combination thereof. The pixel electrode 210, the emission layer 220, and the opposite electrode 230 may form the light emitting element LE.

An encapsulation layer 240 may be disposed on the opposite electrode 230. The encapsulation layer 240 may cover the light emitting element LE to protect the light emitting element LE from impurities such as oxygen, moisture, or the like. The encapsulation layer 240 may include at least one inorganic encapsulation layer and at least one organic encapsulation layer. In an embodiment, the encapsulation layer 240 may include a first inorganic encapsulation layer disposed on the opposite electrode 230, an organic encapsulation layer disposed on the first inorganic encapsulation layer, and a second inorganic encapsulation layer disposed on the organic encapsulation layer. The inorganic encapsulation layer may include silicon nitride, silicon oxynitride or the like, or a combination thereof, and the organic encapsulation layer may include epoxy-based resin, acryl-based resin, polyimide-based resin or the like, or a combination thereof.

Figure 18:
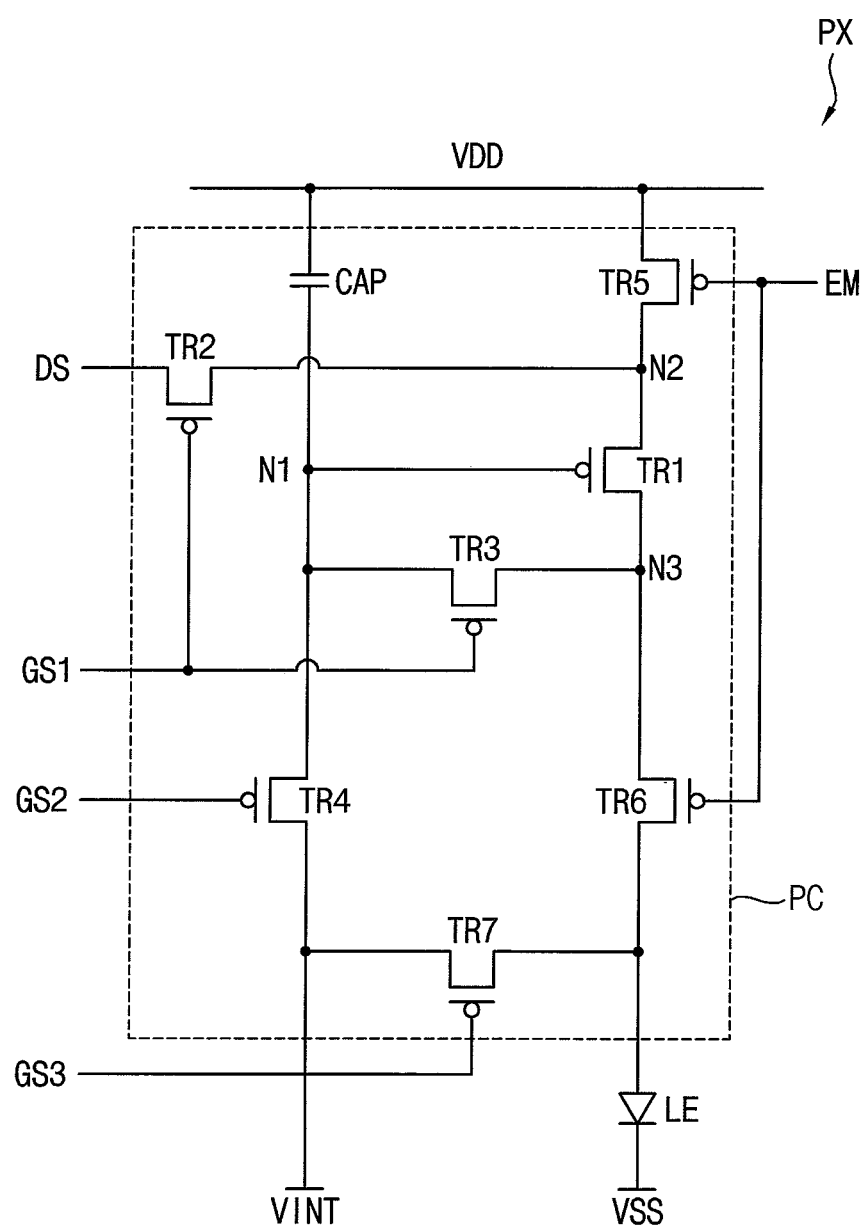
FIG. 18 is a schematic circuit diagram illustrating a pixel according to an embodiment of the invention.

FIG. 18 is a schematic circuit diagram illustrating a pixel according to an embodiment of the invention. For example, FIG. 18 may illustrate an example of the pixel PX illustrated in FIG. 1.

Referring to FIG. 18, a pixel PX according to an embodiment of the invention may include a pixel circuit PC and a light emitting element LE electrically connected to the pixel circuit PC. The pixel circuit PC may provide a driving current to the light emitting element LE. The light emitting element LE may emit light based on the driving current provided from the pixel circuit PC. The pixel circuit PC may include at least one transistor and at least one capacitor for generating the driving current.

In an embodiment, the pixel circuit PC may include a first transistor TR1, a second transistor TR2, a third transistor TR3, a fourth transistor TR4, a fifth transistor TR5, a sixth transistor TR6, a seventh transistor TR7, and a capacitor CAP.

A gate electrode of the first transistor TR1 may be electrically connected to a first node N1. A source electrode of the first transistor TR1 may be electrically connected to a second node N2, and a drain electrode of the first transistor TR1 may be electrically connected to a third node N3. The first transistor TR1 may generate the driving current based on a voltage between the gate electrode and the source electrode.

A first gate signal GS1 may be applied to a gate electrode of the second transistor TR2. A data signal DS may be applied to a source electrode of the second transistor TR2, and a drain electrode of the second transistor TR2 may be electrically connected to the second node N2. The second transistor TR2 may transmit the data signal DS to the second node N2 based on the first gate signal GS1.

The first gate signal GS1 may be applied to a gate electrode of the third transistor TR3. A source electrode of the third transistor TR3 may be electrically connected to the first node N1, and a drain electrode of the third transistor TR3 may be electrically connected to the third node N3. The third transistor TR3 may connect the gate electrode and the drain electrode of the first transistor TR1 based on the first gate signal GS1 to compensate a threshold voltage of the first transistor TR1.

A second gate signal GS2 may be applied to a gate electrode of the fourth transistor TR4. In an embodiment, in case that the pixel PX is included in an N-th pixel row, the second gate signal GS2 may be a first gate signal applied to an (N−1)-th pixel row. An initialization voltage VINT may be applied to a source electrode of the fourth transistor TR4, and a drain electrode of the fourth transistor TR4 may be electrically connected to the first node N1. The fourth transistor TR4 may transmit the initialization voltage VINT to the first node N1 based on the second gate signal GS2 to initialize the gate electrode of the first transistor TR1.

An emission control signal EM may be applied to a gate electrode of the fifth transistor TR5. A first power voltage VDD may be applied to a source electrode of the fifth transistor TR5, and a drain electrode of the fifth transistor TR5 may be electrically connected to the second node N2.

The emission control signal EM may be applied to a gate electrode of the sixth transistor TR6. A source electrode of the sixth transistor TR6 may be electrically connected to the third node N3, and a drain electrode of the sixth transistor TR6 may be electrically connected to the light emitting element LE. The fifth transistor TR5 and the sixth transistor TR6 may transmit the driving current generated from the first transistor TR1 to the light emitting element LE based on the emission control signal EM.

A third gate signal GS3 may be applied to a gate electrode of the seventh transistor TR7. In an embodiment, in case that the pixel PX is included in an N-th pixel row, the third gate signal GS3 may be a first gate signal applied to an (N+1)-th pixel row. An initialization voltage VINT may be applied to a source electrode of the seventh transistor TR7, and a drain electrode of the seventh transistor TR7 may be electrically connected to the light emitting element LE. The seventh transistor TR7 may transmit the initialization voltage VINT to the light emitting element LE based on the third gate signal GS3 to initialize the light emitting element LE.

The first power voltage VDD may be applied to a first electrode of the capacitor CAP, and a second electrode of the capacitor CAP may be electrically connected to the first node N1. The capacitor CAP may maintain the voltage between the gate electrode and the source electrode of the first transistor TR1 in case that the second transistor TR2 is turned off, so that the light emitting element LE may emit light.

A first electrode of the light emitting element LE may be electrically connected to the pixel circuit PC, and a second power voltage VSS may be applied to a second electrode of the light emitting element LE. In an embodiment, the second power voltage VSS may be less than the first power voltage VDD. The light emitting element LE may emit light based on the driving current transmitted from the pixel circuit PC.

The first transistor TR1 and the capacitor CAP illustrated in FIG. 18 may have a structure of the first transistor TR1 and a structure of the capacitor CAP illustrated in FIGS. 3, 13, 15, or 16, respectively. Further, each of the second transistor TR2, the third transistor TR3, the fourth transistor TR4, the fifth transistor TR5, the sixth transistor TR6, and the seventh transistor TR7 illustrated in FIG. 18 may have a structure of the second transistor TR2 illustrated in FIGS. 3, 13, 15, or 16.

The display device according to the embodiments may be applied to a display device included in a computer, a notebook, a mobile phone, a smartphone, a smart pad, a PMP, a PDA, an MP3 player, or the like.

Although the display device and the method of manufacturing the display device according to the embodiments have been described with reference to the drawings, the illustrated embodiments are examples, and may be modified and changed by a person having ordinary knowledge in the relevant technical field without departing from the technical spirit described in the following claims including their equivalents.

What is claimed is:

1. A display device, comprising:
   a substrate;
   a first active layer disposed on the substrate;
   a first insulation layer disposed on the first active layer;
   a first gate electrode disposed on the first insulation layer, the first gate electrode overlapping the first active layer;
   a second insulation layer disposed on the first gate electrode;
   a second active layer disposed on the second insulation layer;
   a first capacitor electrode disposed on the second insulation layer, the first capacitor electrode overlapping the first gate electrode;
   a third insulation layer disposed on the second active layer and the first capacitor electrode;
   a second gate electrode disposed on the third insulation layer, the second gate electrode overlapping the second active layer; and
   a second capacitor electrode disposed on the third insulation layer, the second capacitor electrode overlapping the first gate electrode and electrically connected to the first capacitor electrode.

2. The display device of claim 1, wherein the first capacitor electrode and the second active layer include a same material.

3. The display device of claim 1, wherein the first active layer includes polycrystalline silicon.

4. The display device of claim 1, wherein the second insulation layer includes silicon nitride.

5. The display device of claim 1, wherein a permittivity of the second insulation layer is greater than a permittivity of the third insulation layer.

6. The display device of claim 1, wherein the second active layer and the first capacitor electrode each include an oxide semiconductor.

7. The display device of claim 1, wherein the third insulation layer includes silicon oxide.

8. The display device of claim 1, wherein a hydrogen content of the third insulation layer is less than a hydrogen content of the second insulation layer.

9. The display device of claim 1, wherein the second capacitor electrode does not overlap the first capacitor electrode.

10. The display device of claim 1, wherein the second capacitor electrode overlaps the first capacitor electrode.

11. The display device of claim 1, further comprising:
a fourth insulation layer disposed on the second gate electrode and the second capacitor electrode; and
a connection electrode disposed on the fourth insulation layer, the connection electrode electrically connecting the second capacitor electrode and the first capacitor electrode.

12. The display device of claim 11, wherein a constant voltage is applied to the connection electrode.

13. The display device of claim 11, further comprising:
a first source electrode and a first drain electrode disposed on the fourth insulation layer and electrically connected to the first active layer; and
a second source electrode and a second drain electrode disposed on the fourth insulation layer and electrically connected to the second active layer,
wherein the connection electrode, the first source electrode, the first drain electrode, the second source electrode, and the second drain electrode are disposed on a same layer.

14. The display device of claim 13, further comprising:
a pixel electrode electrically connected to the first source electrode or the first drain electrode;
an emission layer disposed on the pixel electrode; and
an opposite electrode disposed on the emission layer.

15. The display device of claim 1, further comprising:
a lower electrode disposed between the first insulation layer and the second insulation layer, the lower electrode overlapping the second active layer.

16. The display device of claim 15, wherein the lower electrode is electrically connected to the second gate electrode.

17. A method of manufacturing a display device, the method comprising:
forming a first active layer on a substrate;
forming a first insulation layer on the first active layer;
forming a first gate electrode on the first insulation layer, the first gate electrode overlapping the first active layer;
forming a second insulation layer on the first gate electrode;
forming a second active layer on the second insulation layer;
forming a first capacitor electrode on the second insulation layer, the first capacitor electrode overlapping the first gate electrode;
forming a third insulation layer on the second active layer and the first capacitor electrode;
forming a second gate electrode on the third insulation layer, the second gate electrode overlapping the second active layer; and
forming a second capacitor electrode on the third insulation layer, the second capacitor electrode overlapping the first gate electrode and electrically connected to the first capacitor electrode.

18. The method of claim 17, wherein
the forming of the second active layer and the forming of the first capacitor electrode are simultaneously performed, and
the forming of the second gate electrode and the forming of the second capacitor electrode are simultaneously performed.

19. The method of claim 18, wherein the forming of the second active layer and the first capacitor electrode comprises:
forming an oxide semiconductor layer on the second insulation layer;
etching the oxide semiconductor layer to form the second active layer and the first capacitor electrode; and
injecting impurities into the second active layer and the first capacitor electrode using the second gate electrode and the second capacitor electrode as masks.

20. The method of claim 18, wherein the forming of the second gate electrode and the second capacitor electrode comprises:
forming a conductive layer on the third insulation layer; and
etching the conductive layer to form the second gate electrode and the second capacitor electrode.

21. The method of claim 18, further comprising:
forming a fourth insulation layer on the second gate electrode and the second capacitor electrode;
forming a first contact hole in the third insulation layer and the fourth insulation layer, the first contact hole exposing the first capacitor electrode;
forming a second contact hole in the fourth insulation layer, the second contact hole exposing the second capacitor electrode; and
forming a connection electrode on the fourth insulation layer, the connection electrode filling the first contact hole and the second contact hole.

22. The method of claim 21, wherein the forming of the first contact hole and the forming of the second contact hole are simultaneously performed.

23. The method of claim 18, further comprising:
forming a lower electrode between the first insulation layer and the second insulation layer, the lower electrode overlapping the second active layer.

24. The method of claim 23, wherein the forming of the first gate electrode and the forming of the lower electrode are simultaneously performed.

25. A display device, comprising:
a substrate;
a first transistor including:
a first active layer disposed on the substrate;
a first insulation layer disposed on the first active layer; and
a first gate electrode disposed on the first insulation layer, the first gate electrode overlapping the first active layer;

a capacitor including:
   the first gate electrode;
   a second insulation layer disposed on the first gate electrode;
   a first capacitor electrode disposed on the second insulation layer;
   the first capacitor electrode overlapping the first gate electrode;
   a third insulation layer disposed on the first capacitor electrode; and
   a second capacitor electrode disposed on the third insulation layer, the second capacitor electrode overlapping the first gate electrode and electrically connected to the first capacitor electrode; and
a second transistor including:
   a second active layer disposed between the second insulation layer and the third insulation layer, the second active layer and the first capacitor electrode including a same material;
   the third insulation layer; and
   a second gate electrode disposed on the third insulation layer, the second gate electrode overlapping the second active layer.

26. The display device of claim 25, wherein the first active layer includes polycrystalline silicon.

27. The display device of claim 25, wherein the second active layer and the first capacitor electrode each include an oxide semiconductor.

28. The display device of claim 25, wherein the second transistor further includes a lower electrode disposed between the first insulation layer and the second insulation layer, the lower electrode overlapping the second active layer.

29. The display device of claim 28, wherein the lower electrode is electrically connected to the second gate electrode.

30. A display device, comprising:
   a first active layer on a substrate;
   a first gate electrode overlapping the first active layer, the first gate electrode being insulated from the first active layer;
   a first capacitor electrode overlapping a first portion of the first gate electrode, the first capacitor electrode being insulated from the first gate electrode;
   a second active layer not overlapping the first gate electrode, the second active layer and the first capacitor electrode including a same material;
   a second gate electrode overlapping the second active layer, the second gate electrode being insulated from the second active layer; and
   a second capacitor electrode overlapping a second portion of the first gate electrode, the second capacitor electrode being insulated from the first gate electrode and electrically connected to the first capacitor electrode.

31. The display device of claim 30, wherein the second capacitor electrode does not overlap the first capacitor electrode.

32. The display device of claim 30, wherein the second capacitor electrode overlaps the first capacitor electrode.

33. The display device of claim 30, further comprising:
   a connection electrode overlapping the first capacitor electrode and the second capacitor electrode, the connection electrode electrically connecting the second capacitor electrode and the first capacitor electrode.

34. The display device of claim 30, wherein the second active layer and the first capacitor electrode are disposed in a same layer.

* * * * *